United States Patent [19]

Brewer et al.

[11] Patent Number: 5,038,195
[45] Date of Patent: Aug. 6, 1991

[54] COMPOSITION AND COATING TO PREVENT CURRENT INDUCED ELECTROCHEMICAL DENDRITE FORMATION BETWEEN CONDUCTORS ON DIELECTRIC SUBSTRATE

[75] Inventors: William D. Brewer, Berlin, Fed. Rep. of Germany; Kurt R. Grebe, Beacon, N.Y.; Raymond R. Horton, Dover Plains, N.Y.; Linda C. Matthew, Peekskill, N.Y.; Ismail C. Noyan, Peekskill, N.Y.; Michael J. Palmer, Walden, N.Y.; Sampath Purushothaman, Yorktown Heights, N.Y.; David L. Rath, Stormville, N.Y.

[73] Assignee: IBM, Yorktown Heights, N.Y.

[21] Appl. No.: 477,705

[22] Filed: Feb. 9, 1990

[51] Int. Cl.⁵ ............................................. M01L 23/48
[52] U.S. Cl. ........................................ 357/70; 357/71; 357/68; 357/80; 428/675; 427/96
[58] Field of Search ............... 357/71, 74, 71 R, 67 R, 357/67, 70; 428/675; 427/96

[56] References Cited

U.S. PATENT DOCUMENTS

| Re. 31,967 | 8/1985 | Burns | 357/70 |
| 3,645,785 | 2/1972 | Hentzschel | 357/67 |
| 4,301,188 | 11/1981 | Niehaus | 357/67 |
| 4,498,121 | 2/1985 | Breedis et al. | 357/74 |
| 4,707,724 | 11/1987 | Suzuki et al. | 357/71 |
| 4,717,591 | 1/1988 | Acosta et al. | 427/96 |

OTHER PUBLICATIONS

IBM Technical Disclosure Bulletin, vol. 18, No. 15, 10-75, "Depositing Adhesion Layers for Contact Between Noble Metals and Dielectric Material", by Romankiw.

Primary Examiner—Andrew J. James
Assistant Examiner—T. Davenport
Attorney, Agent, or Firm—Rosen, Dainow & Jacobs

[57] ABSTRACT

The present invention comprises the use of a copper/nickel containing alloy composition or application of a protective nickel alloy coating to copper current-carrying leads to prevent electrolytic migration between tape automated bonding (TAB) package leads.

49 Claims, 3 Drawing Sheets

COMPOSITION AND COATING TO PREVENT CURRENT INDUCED ELECTROCHEMICAL DENDRITE FORMATION BETWEEN CONDUCTORS ON DIELECTRIC SUBSTRATE

DESCRIPTION

1. Technical Field

The present invention generally relates to microelectronic circuitry packages. One embodiment comprises a substrate having adhered thereon a plurality of nickel-copper alloy current-carrying leads. Optionally, an intermediate adhesion promoting layer is located between the substrate and the leads.

Another embodiment relates to electronic circuit packages comprising a substrate and copper current-carrying leads wherein the exposed area of the copper current-carrying leads is overplated with a more durable metal, such as a noble metal, to thereby enhance the circuits' corrosion resistance, solderability and bondability. This durable metal layer is in turn plated with a nickel-containing barrier layer.

By virtue of the alloy composition or the protective coating materials applied to the copper current-carrying leads in accordance with the present invention, electrolytic migration, i.e. the formation of dendrites between Tape Automated Bonding (TAB) package leads can be substantially reduced or eliminated.

2. Background Art

Electrolytic migration in metals has been a problem in microelectronic packaging for years and is becoming more threatening as line spacings become smaller and electric fields larger. Thus as the microelectronic arts progress, the conductor spacings on the dielectric substrates decrease. The resultant decreased spacings between the leads enhances electrolytic migration which is manifested by the formation of dendrites that act to short parallel or substantially parallel adjacent leads held at different electrical potentials.

The basic requirements for the formation of dendrites are the presence of two differently biased metal electrodes, an electrolyte and time. These factors in combination form an electrolytic cell such that under bias, the metal of the lead goes into solution at an anode (i.e. a first lead) in the form of metal ions, and the resultant ions migrate through the electrolyte to a cathode (i.e. a second lead) where they are reduced and deposited. This problem is particularly significant for a system comprising copper leads disposed on a polymer substrate.

In such a system, the polymer substrate absorbs and adsorbs water from the atmosphere. This water, in combination with ionic residue (from manufacturing or other processing steps) present on the polymer substrate surface, forms an electrolyte. A differential bias between the copper leads results in electrolytic copper plating that forms dendrites at the cathode with the result that after a relatively short period of time, a bridge of dendrites forms between the leads thereby resulting in a short.

Electrolytic migration and the corresponding formation of dendrites is known to occur very rapidly for silver and less rapidly for many other metals including copper. Electrolytic migration can be a problem with gold as well, although halide ions seem to be an additional requirement for the formation of gold dendrites.

At one time, it was believed that corrosion-type problems relating to copper leads could be prevented by coating the leads in a package with a thin layer (e.g., about 0.6 $\mu$m) of gold. However, even in such packages which have been coated with a thin layer of gold, dendrites are still formed as a result of copper dissolving from poorly coated areas or gold dendrites are formed in the presence of chloride ions.

Another especially troublesome problem associated with microelectronic packaging system is the delamination of the copper leads from the substrate. In the event of delamination of the copper lead, the copper on the underside of the lead provides a large source of metal ions for electrolytic migration.

One alternative preventive method which has been used, is to coat the entire package with a non-porous dielectric material. This coating is intended to prevent the adsorption and absorption of the moisture between the leads, and to provide a physical barrier to dendrite formation. A serious drawback to this approach is that it relies on a "zero-defect" criterion which means that any delamination or pin holes in the coating could cause failure.

The prior art discloses the use of the individual metal layers disclosed in the present invention alone and in combination, however the composition and arrangement of specific metal layers of the present invention are not disclosed.

For example, U.S. Pat. No. 4,323,060 discloses a method of electrolessly depositing nickel or cobalt, including nickel containing phosphorous over a copper conductor on a board. Gold can be deposited on the nickel coated copper line to provide for corrosion resistance or to enhance the line solderability.

Likewise, U.S. Pat. No. 4,503,131 discloses depositing nickel or nickel-phosphorous between a copper conductor and a top layer of gold to provide enhanced corrosion resistance and to meet industry contact resistance standards under severe exposure conditions.

U.S. Pat. No. 4,717,591 is typical of the metal coating disclosures in that it discloses a coating of nickel-phosphorous on to copper leads.

There is no disclosure in the representative prior art references relating in general to the subject matter of the instant invention that discloses or suggests the composition or structure of the present invention.

SUMMARY OF THE INVENTION

The present invention comprises a system wherein the formation of dendrites between leads in a package is substantially slowed or reduced to the extent that dendrite formations will not occur within the useful life of the product.

A first embodiment of the present invention relates to leads comprising nickel/copper alloys which are used in electronic circuitry packages instead of copper alone. The nickel/copper alloys with compositions ranging from about 10% to 80% nickel are extremely resistant to dendrite formation. Consequently electrolytic migration in TAB or other packaging structures can be prevented by forming the entire lead structure from the nickel/copper alloy having the composition range noted above.

The use of the nickel/copper alloy eliminates the need for a corrosion coating and introduces a critical advantage in that the success of the invention does not rely on a zero-defect criterion. In effect, the behavior of the entire system has been modified and random defects will not cause it to fail.

In most micro electronic systems leads are formed from substantially pure copper. The benefit of the use of the Ni/Cu alloy is illustrated by applying a voltage differential across at least two adjacent leads with the result that substantially no dendrites are formed, whereas dendrites do form between pure copper leads under identical conditions during the useful life of the product.

In addition to the cost saving realized by the elimination of a gold coating, the delamination of metal leads from a substrate, such as polyimide commonly used in TAB packages, which would normally allow catastrophic migration of ions, is no longer a problem with the nickel/copper lead system, because no new source of copper is exposed when the leads delaminate.

Their low electrical conductivity makes certain ranges of nickel concentrated alloys less desirable as lead materials, but unexpectedly it has been determined that when certain nickel concentrations such as low nickel concentrations, i.e. about 10%, are used, the electrical resistivity is low enough to allow use of the alloy for the entire lead. Higher concentrations of nickel can be used effectively depending upon the amount of nickel and the use to which the lead is to be put.

An alternative embodiment comprises the use of a nickel-gold alloy in the composition of the lead rather than the nickel-copper. Preferably, between about 10% and 20% nickel is used in the nickel-gold alloy. This composition also eliminates the need for any cladding or coating to prevent formation of dendrites.

Another embodiment of the invention comprises a substrate having a plurality of copper leads disposed thereon and having a thin layer of an adhesion promoting metal such as chrome disposed between the substrate and the copper lead. A thin protective coating layer, or cladding of a noble metal such as gold is deposited on the exposed top and sides of the copper lead along its length. A protective layer containing nickel or a nickel alloy is then deposited on the exposed noble metal layer.

An alternative embodiment of the invention comprises a plurality of copper leads disposed on a substrate wherein the leads have a coating of nickel or nickel alloy that covers the exposed surface of the leads. There is also a layer of nickel or nickel alloy between the underside of the copper leads and the substrate. This thin layer of nickel serves as an "inert foot" or base layer which acts to inhibit electrolytic migration of ions. Further, in this embodiment, there is optionally a metal adhesion layer between the nickel or nickel alloy layer covering the underside of the leads and the substrate.

It has been determined that the embodiments generally described above having outer coatings of nickel or nickel alloy must be subjected to a special treatment before bonding is practical since the nickel or nickel alloy, e.g. NiP, is not readily wettable making outer lead bonding (OLB) and inner lead bonding (ILB) substantially difficult.

Accordingly, in another embodiment of the present invention, the OLB and ILB leads described above are pretreated so that they do not contain the nickel or nickel alloy in regions to be soldered. Instead, the solderwettable metal on the conductor, e.g. gold, is left exposed at the required soldering regions making the lead suitable for bonding.

DESCRIPTION OF THE DRAWINGS

FIG. 4 is a schematic view depicting the one step method for resist application in accordance with the present invention.

FIG. 8 is a perspective of a finished lead after the resist has been removed exposing a surface for soldering.

DESCRIPTION OF THE PREFERRED EMBODIMENTS

The preferred embodiments of the present invention comprise current-carrying conductor lines positioned in close proximity to one another disposed on a dielectric substrate.

Figure 1:
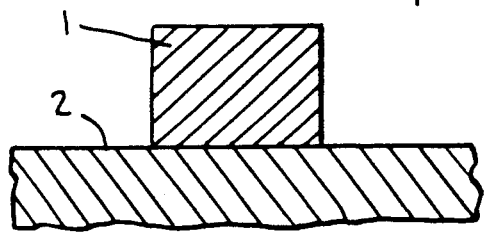
FIG. 1 is a cross sectional view illustrating the micro electronic lead comprising a substrate having a nickel containing alloy lead thereon.

FIG. 1 is a cross sectional view of lead 1 disposed on substrate 2. The substrate can be any convenient inert backing material depending upon the application to which it is to be put and must have the appropriate insulating properties to allow its use in accordance with the packaging system. The preferred substrate is polyimide, but depending upon the intended applications, it can be any convenient material including quartz, fiber-reinforced epoxy, etc. The insulating substrate can be composed also of an electrically insulating material such as ceramic or glass. It can be of various thicknesses depending upon the requirements for its use. Preferably the thickness is about 50 μm.

The lead is an alloy comprising nickel with copper or nickel with gold. Compositions ranging from about 10% to about 80% nickel, preferably greater than 10% nickel, are extremely resistant to dendrite formation. The preferred nickel/gold alloy contains between about 10% and 20% nickel.

To illustrate the unexpected benefits of the nickel-copper alloy leads, a number of gold coated copper leads on a substrate were tested under the same conditions (i.e. deionized water, 100 μm spacing between leads and 1V/25 μm applied across the test leads) as a number of leads comprising a 10/90 Ni/Cu alloy. The gold-coated copper leads which served as the standard, failed within 2-60 seconds. The Ni/Cu leads on the other hand had no dendrites formed after more than 45 minutes. Other tests using different metal layers also failed.

The structure of FIG. 1 can be fabricated using any standard method that will provide a secure bond between the bottom side of the lead and the top surface of the substrate. Optionally an adhesion promoting metal layer can be deposited on the substrate to promote the adhesion of the lead to the substrate. The adhesion layer metal is preferably Cr or Cr compound however, Nb, Ti, Ta etc can also be used. The layer deposition can be accomplished by any well known chemical vapor deposition methods, sputtering and the like. This adhesion promoting metal layer also serves as a diffusion barrier upon which the leads are secured. The adhesion layer is 20 nm to 40 nm thick, preferably 30 nm.

Figure 2:
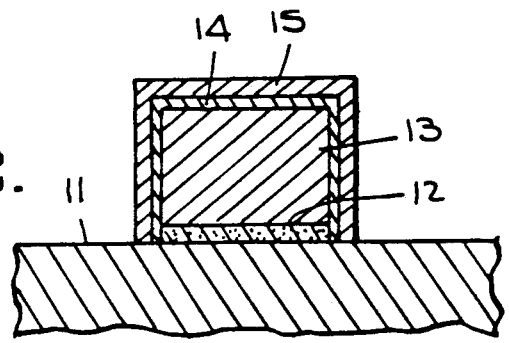
FIG. 2 is a cross sectional view illustrating the microelectronic lead comprising a substrate, lead and protective layers according to one embodiment of the present invention.

FIG. 2 is a sectional view illustrating another embodiment of the invention. In FIG. 2, reference numeral 11 represents the substrate. The substrate can be formed of any convenient material as set forth above.

Reference number 12 of FIG. 2 is an adhesion promoting metal layer. Adhesion layer 12, as noted in the embodiment described above, is preferably a Cr or Cr compound that has been sputtered or evaporated down, etc. on the substrate. Optionally it can be Nb, Ti, Ta, etc. The thickness of the adhesion promoting layer is between 20nm and 40nm preferably about 30nm. Preferably, the bond strength between the substrate and adhesion promoting metal layer is such that the substrate-metal layer bond strength should be greater than or equal to 30g/mm to lift according to the strip peel test.

Reference numeral 13 represents the current carrying conductors or leads typically comprising copper and alloys of copper or other materials which often contain copper. Leads 13 are, therefore composed of corrosible materials which provide a source of ions for dendrite build-up under proper conditions, i.e. electrolytic when situated in close proximity to a neighboring conductor. The lead can conveniently have a thickness of between 3µm and 1000 µm and a width of a similar dimensions.

A thin protective noble metal coating layer such as gold, represented by numeral 14, is deposited on lead 13. The thickness of the noble metal coating is guided by how much of the metal needs to be applied to reduce surface corrosion of the copper lead and allow solderability. Generally the thickness when gold is the metal is about 0.6 µm although it can be applied in the range of 0.1 µm 2.0 µm.

A nickel-containing coating 15 is applied to the noble metal layer 14. The nickel-containing coating 15 may conveniently comprise pure nickel, NiP having 0-20 weight percent P; NiB having 0-20% B; NiCu having a minimum of 10 weight percent Ni; NiAu having a minimum of 10 up to about 20 weight percent Ni. The thickness of the nickel, or nickel alloy layer 14 ranges between 0.03 µm and 2 µm.

Figure 3:
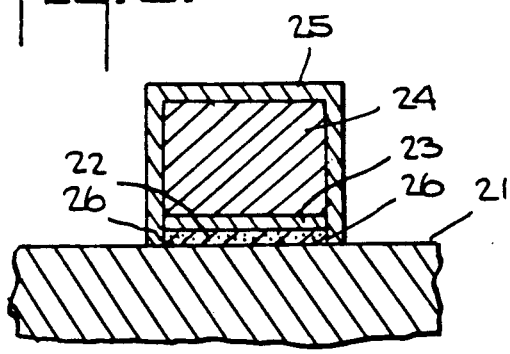
FIG. 3 is a cross sectional view illustrating another embodiment of the invention comprising a substrate supporting the lead with a nickel-containing alloy which encapsulates the entire lead.

FIG. 3 represents another embodiment of the invention. In FIG. 3, reference numeral 21 represents the substrate comprising any of the materials mentioned above provided it is a material compatible in use with the metal layer deposited thereon. FIG. 3 depicts an optional layer 22 comprising an adhesion layer of chromium or the other suitable metals as described above. Layer 23 is a base layer of nickel, the upper surface of which is in contact with the underside of copper lead 24, while the bottom surface thereof is in contact with metal adhesion layer 22. Protective coating 25 is nickel or an alloy thereof, (e.g. NiP, NiB, NiCu, NiAu) having the composition and thickness as described above, and surrounds the sides and top of lead 24 as well as covering the sides of layer 22 down to and including the intersection 26 of the sides of the adhesion layer 22 with the surface of substrate 21. As can be seen from FIG. 3, with the nickel-containing coating on each side of the lead intersecting and contacting said nickel-containing base layer, the copper lead is encapsulated or enveloped by the nickel compound to form a continuous non-corrosive coating so that electrolytic migration is greatly inhibited. In this embodiment a gold layer (not shown) may if desired be coated on the sides and top of the lead 24 before the nickel protective barrier layer is applied. The embodiment depicted in FIG. 3 has the same parameters as to composition, relative proportions and thicknesses that apply to the embodiment depicted in FIG. 2 and disclosed above.

It has been demonstrated that the nickel alloys disclosed above are extremely resistant to dendrite formation. Thus, electrolytic migration in packaging structures as shown in FIGS. 2 and 3 can be prevented by coating all or an exposed portion of the lead structure with the NiP alloy material.

A further particular improvement that has been developed with respect to the embodiments disclosed herein is the result of the determination that an alloy such as NiP coating on leads is not sufficiently wettable by solder thus making the OLB and ILB extremely difficult to process further for commercial applications where solder attachment of the OLB and ILB is required.

The difficulty that exists in processing leads in TAB frame packages containing the elements described in FIGS. 2 and 3 is because NiP coatings thereon are not sufficiently wettable by solder. This problem is eliminated in accordance with the present invention, by stamping the ILB and OLB with a resist material after the gold layer (if any) is deposited and before the NiP is electroplated onto the lead.

Since solder wets gold well, it was believed that the problem noted above could be solved merely by depositing a thin layer of gold on top of the NiP coating as such coating is depicted in FIG. 2 and referred to in the discussion concerning same. However, upon testing, this structure behaved as if there were no protective coating present as dendrites formed, indicating that the NiP must be on the outer surface of the leads to prevent dendrite formation. Consequently, the use of gold to solve the wetting problem associated with soldering essentially requires that the gold be deposited directly on the ILB and OLB copper current carrying leads of the TAB frame.

This requirement introduces new problems in that typically, the application of the NiP to selective areas of the frame would require the masking of specific sites along the length of the OLB's and ILB's with photoresist. This is relatively easily done, but it adds significantly to the cost of the finished product because it requires the labor intensive steps of photoresist application, alignment of masks and parts, exposure and development. Further, the equipment and complicated steps for this process make it expensive.

As a solution to the problem, in accordance with the present invention, a method for application of resist material to the leads has been devised which capitalizes on the fact that very tight alignment tolerances are not necessary for placement of the gold on the ILB and OLB. This makes it possible to apply resist to the ILB and OLB from a rotating drum which has a raised pattern on its surface.

FIG. 4 is provided merely to show the location of the resist application step in the overall process of making frames having ILB and OLB on a TAB line as the TAB line undergoes several different plating steps during the manufacturing process. For example box 31 in FIG. 4 represents the step in the TAB line manufacturing process where gold is deposited on the leads on TAB line 30. After the gold deposition on such leads, TAB line 30 passes through a set of rolls 32 and 32'. Roll 32 has one or more raised rectangular patterns on its surface which are shown in detail FIGS. 5 and 6. Roll 32' is not used in the process discussed in detail herein, however it is included to demonstrate that it can be used in a manner identical to 32 if one desires to use the procedure of the instant invention on a two side TAB line process.

The rectangular patterns noted on the roll comprise a smaller rectangle situated within a larger rectangle. Roll 32 acts much like a printing roll as it impresses a resist onto specific areas of the ILB and OLB of the TAB line, which lie directly beneath the surface of the raised pattern on the roll that dispenses the resist material. The spatial relationship between the pattern on the roll and the TAB line during the "stamping" process will be discussed in more detail hereinafter with respect to FIGS. 5, 6 and 7.

Once ILB and OLB's on TAB line 30 are coated with resist at the appropriate locations thereon, the TAB line continues over roll 35 into a nickel plating solution 33 under rolls 36, 37, all contained in vessel 34. The TAB line 30 is plated electrolytically or electrolessly with a nickel alloy, preferably NiP, in vessel 34, is removed from the plating bath and is directed over roll 38 and is then subjected to a treatment step wherein the resist applied previously via roll 32 is removed. This step is represented by box 39.

Figure 5:
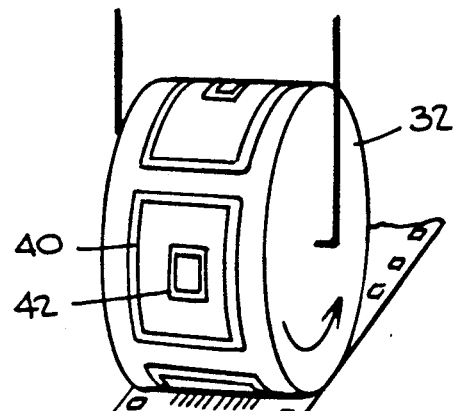
FIG. 5 is a perspective of a TAB line and a roll having a plurality of a raised rectangular patterns thereon each of which applies the resist to the OLB and ILB leads shown on the TAB line in accordance with the present invention.

FIG. 5 is a perspective view of roll 32 (of FIG. 4) as it is about to stamp the OLB and ILB of TAB line 30 with resist material. (Roll 32' is not shown.) The TAB line 30 and the roll 32 each travel in the direction of the respective arrows indicated in FIG. 5.

As noted previously, roll 32 contains on its surface a raised rectangular pattern which consists of rectangle 40, having within it smaller rectangle 42. The four sides of the outer rectangle 40 are dimensioned to exactly coincide with the proper location of the OLB on TAB line 30 as it travels under roll 32 and is stamped with the resist that is applied.

Likewise, the four sides of the smaller inner rectangle 42 are dimensioned to exactly coincide with the proper location of the ILB as it travels under the roll and is stamped with the resist that is applied.

Figure 6:
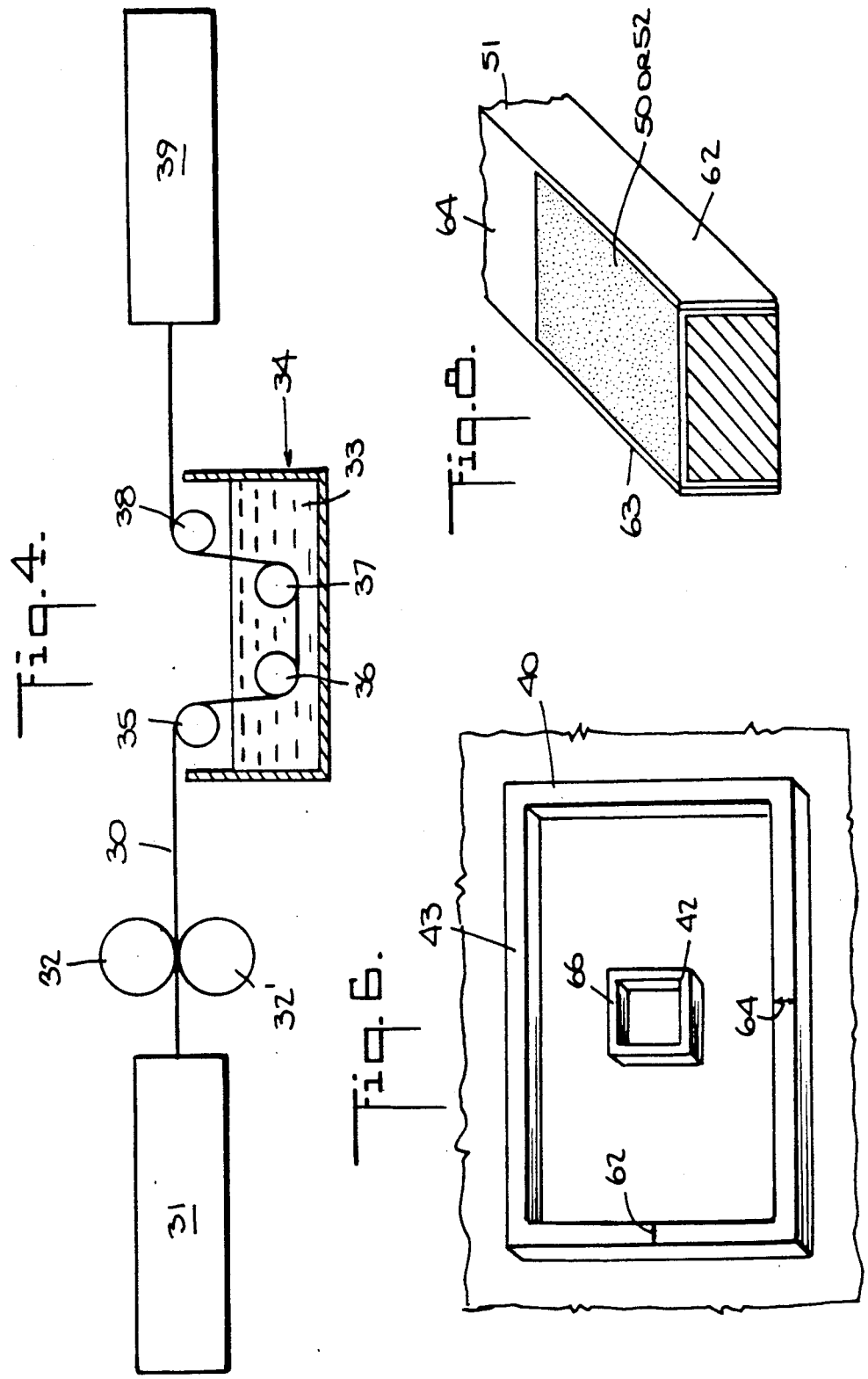
FIG. 6 is a plan view of the raised rectangular pattern positioned on the face of a stamping roll which applies the resist to the OLB and ILB leads in accordance with the present invention.

FIG. 6 is a top view of roll 32 depicted in FIG. 5 which shows the set of rectangles 40 and 42 that apply resist to the surface of the ILB and OLB. The rectangles 40, 42 may be squares depending upon which configuration is needed. FIG. 6 shows that the even printing surface 43 which is capable of dispensing resist material through openings on the surface thereof, or in any other convenient manner is elevated above the surface of roll 32.

As noted, the dimensions of the rectangular FIGS. 40, 42, i.e. either rectangle or squares, is a function of the dimensions of the ILB and OLB and their relative positions with respect to each other. The larger figure can conveniently be up to 4 cm in width with the raised substantially flat printing surface 62 of the rectangle 40 being about 0.6 cm. In the case of a rectangle, the smaller side can be about 2.5 cm with the width of the raised substantially flat printing surface 64 being about 0.5 to 0.6 cm.

Accordingly, the dimension of the smaller rectangular FIG. 42 situated within larger FIG. 40 can be about 1 cm by 1 cm with the raised substantially flat printing surface 16 of said FIG. 42 being about 0.1 cm.

These dimensions are provided for illustrative purposes only, are not limiting and obviously will be adjusted to suit the dimensions of the TAB frame which is being treated so as to insure that the resist is applied in the proper areas.

Figure 7:
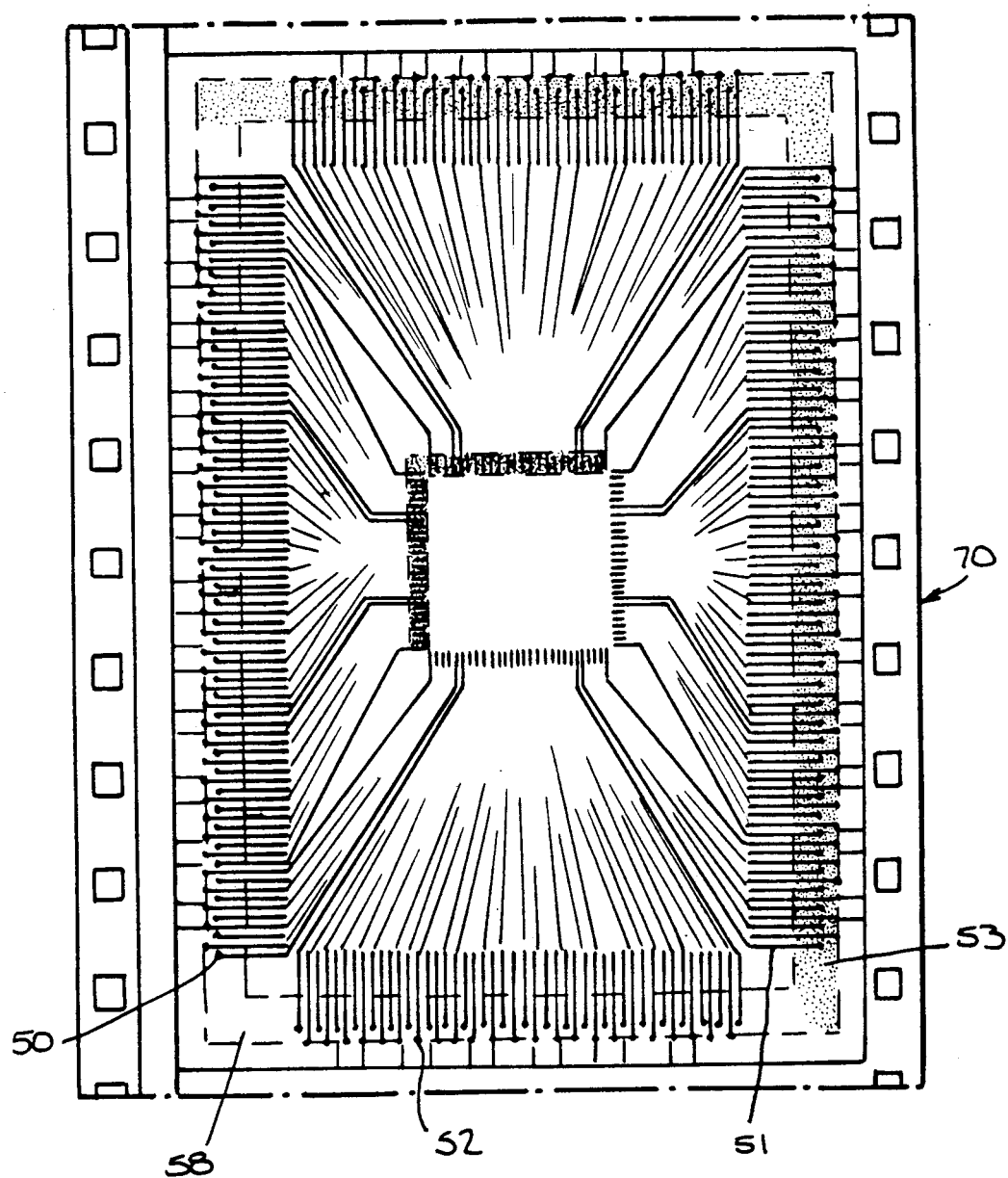
FIG. 7 is a plan view of a TAB frame showing the ILB, OLB and defining an area to be coated with resist.

FIG. 7 is a top view of a TAB frame 70 which is a magnified section of line 30. The four outside edges of frame 70 comprise the OLB and the electrical contact sites are arranged adjacent to one another on each edge around the periphery of the frame. Site 50 is illustrative of one of the plurality of contact points that comprise the OLB site 52 is illustrative of the plurality of contact points that are disposed toward the center of the frame and comprise the ILB. A plurality of leads, illustrated by lead 51 are positioned in adjacent relationships around the frame.

FIG. 7 shows a shaded area 53 along two sides of the outer periphery of the frame 70 and covering the area occupied by the OLB. These shaded areas (53) shown on two sides of the frame represent the area on frame 70 that is covered with resist that has been dispensed from the raised rectangle 40 disposed on roll 32. The outline of the area which would be stamped by the remaining two sides of the raised rectangle on roll 32 if illustrated in the figure is defined by dotted line 58.

In summary, referring to FIGS. 4 through 7, the process utilizes a metallized TAB frame 30 comprising a substrate, an optional adhesion promoting layer, a corrosible metal capable of providing ions which under electrolytic conditions form dendrites with adjacent leads, e.g. the required Cu or other metallurgy which has been coated with gold. The TAB frames 30 as described are then stamped by rectangular patterns 40, 42 located on roll 32 to apply resist on the top surface of ILB such as along 52 and OLB such as along 50. The next step is to subject the line to an electroplating step with NiP coating (either electrolytically or electrolessly onto the gold surface) and then finally subjecting the NiP plated package to a resist stripping step.

An end section single lead, either 50 or 52 is shown in FIG. 8. This lead has been processed in accordance with the aforementioned method, possesses an uncoated gold site 50 for bonding, and the rest of the coated copper lead 51, i.e. sides 62, 63 top 64, is coated with NiP. Under normal use conditions, the lead sidewalls 62, 63 at the hydrophilic package surface are most subject to corrosion. Using the instant method, these areas are still protected. This process eliminates expensive equipment and labor needed for a photolithographic step and adds only a roll-coat and wet-stripper step.

With regard to the method of making the embodiments disclosed herein and depicted in FIGS. 2-3, the NiP can be conveniently deposited on the lead more than one way; it can be either electroplated or electrolessly plated. The different deposition methods give similar results, but allow different processing methods. In addition well known standard photolithography techniques are used with the embodiments being appropriately masked and subtractively etched using an etchant process comprising for example a double bath of potassium iodide-iodine (KI-$I_2$) followed by $KMnO_4$ in caustic solution.

A suitable illustrative TAB processing sequence in accordance with the present invention comprises the following steps. The polymer substrate e.g. polyimide, is seeded using a process to provide a metallic layer deposited on the substrate from an electroless plating bath. This process is disclosed in U.S. Application Ser. No. 07/290,486, filed Dec. 23, 1988 by Viehbeck et al. Between 200-300 nm of NiP flash is electrolessly plated onto the seed layer. A negative dry film photoresist is applied, exposed and the pattern is developed. The copper lead and any other desired metal is electroplated. The photoresist is thereupon stripped with, for example, KOH solution and then the NiP flash is stripped with 10% $HNO_3$ solution. The NiP coating is then electroplated, or seed leads and electrolessly plated.

Alternatively, another processing sequences comprises sputtering the polyimide with an adhesion layer of Cr, about 20 to 40 NM thick; sputter a copper flash about 100 to 300 nm thick; a negative dry film photoresist is applied, exposed and developed. The copper lead is then electroplated. Subsequently, the photoresist is stripped with KOH solution followed by stripping the copper flash with $NH_4S_2O_8$ (ammonium persulfate) solution. The Cr layer is then stripped with a $KMnO_4$/NaOH solution and then electroplate or seed leads and electrolessly plate a NiP coating.

While the invention has been described in terms of particular embodiments thereof, it would be apparent to those skilled in the art that variations can be made without departing from the spirit and scope of the present invention.

Having thus described our invention, what we claim is new, and desire to secure by Letters Patent is:

1. A microelectronic system suitable for reducing the formation of dendrites between current-carrying leads comprising: a dielectric substrate having secured thereon, current carrying leads comprising an alloy selected from the group consisting of nickel-copper or nickel-gold.

2. The microelectronic system defined in claim 1 wherein said alloy is nickel-copper.

3. The microelectronic system defined in claim 2 wherein said nickel-copper alloy contains between about 10% and 80% nickel.

4. The microelectronic system defined in claim 3 wherein said nickel-copper alloy contains 10% nickel and 90% copper.

5. The microelectronic system defined in claim 3 wherein said alloy contains greater than 10% nickel.

6. The microelectronic system defined in claim 1 wherein said alloy is nickel-gold.

7. The microelectronic system defined in claim 6 wherein said nickel-gold alloy contains between about 10 an 20% nickel.

8. The microelectronic system defined in claim 7 wherein said alloy contains greater than 10% nickel.

9. The microelectronic system defined in claim 1 which contains an adhesion promoting layer between said substrate and said current carrying leads.

10. The microelectronic system defined in claim 9 wherein said adhesion promoting layer is a metal selected from the group consisting of Cr, Nb, Ti or Ta.

11. The microelectronic system defined in claim 10 wherein said adhesion promoting metal is Cr.

12. The microelectronic system defined in claim 9 wherein said alloy is nickel-copper.

13. The microelectronic system defined in claim 12 wherein said nickel-copper alloy contains between about 10% and 80% nickel.

14. The microelectronic system defined in claim 13 wherein said nickel-copper alloy contains 10% nickel and 90% copper.

15. The microelectronic system defined in claim 12 wherein said alloy contains greater than 10% nickel.

16. The microelectronic system defined in claim 9 wherein said alloy is nickel-gold.

17. The microelectronic system defined in claim 16 wherein said nickel-gold alloy contains between about 10 and 20% nickel.

18. The microelectronic system defined in claim 16 wherein said alloy contains greater than 10% nickel.

19. A microelectronic system suitable for reducing the formation of dendrites between current-carrying leads comprising:
  (a) a dielectric substrate having secured thereon,
  (b) an adhesion promoting layer, to which is secured;
  (c) current carrying leads comprising a corrosible metal capable of providing a source of ions which under electrolytic migration conditions, form dendrites with adjacent leads;
  (d) a noble metal coating covering the exposed sides and top of said metal current-carrying leads, and
  (e) a nickel-containing coating which covers the exposed area of said noble metal coating on said current carrying leads.

20. The microelectronic system defined in claim 19 wherein said adhesion promoting layer is a metal selected from the group consisting of Cr, Nb, Ti or Ta.

21. The microelectronic system defined in claim 20 wherein said corrosible metal is selected from the group consisting of copper alloys.

22. The microelectronic system defined in claim 21 wherein said noble metal is selected from the group consisting of Au, Pt, Pd, or Rh.

23. The microelectronic system defined in claim 22 wherein said nickel-containing coating is selected from the group consisting of Ni, NiP, NiB, NiCu or NiAu.

24. The microelectronic system defined in claim 23 wherein said nickel-containing coating is NiP having up to about 20% P.

25. The microelectronic system defined in claim 23 wherein said nickel-containing coating is NiB having up to about 20% B.

26. The microelectronic system defined in claim 23 wherein said nickel-containing coating is NiAu having between about 10 and 20 weight percent Ni.

27. The microelectronic system defined in claim 23 wherein said nickel-containing coating is NiCu having at least 10 weight percent Ni.

28. The microelectronic system defined in claim 24 wherein: said adhesion promoting metal layer has thickness between about 20 nm and 40 nm;
  said current carrying leads have a thickness between about 3 $\mu$m and 1000 $\mu$m and a width between about 3 $\mu$m and 1000 $\mu$m;
  said noble metal coating has a thickness between about 0.1 $\mu$m and 2.0 $\mu$m; and
  said nickel-containing coating has a thickness between 0.03 and 2 $\mu$m.

29. The microelectronic system defined in claim 28 wherein the dielectric substrate is polyimide.

30. The microelectronic system defined in claim 29 wherein said adhesion promoting metal layer is Cr having a thickness of 30 nm.

31. The microelectronic system defined in claim 30 wherein said corrosible metal is copper having a height between about 20 and 40 μm and a width between about 25 and 100 μm.

32. The microelectronic system defined in claim 31 wherein said noble metal coating is gold having a thickness of about 0.6 μm.

33. The microelectronic system in claim 32 wherein said nickel-containing coating is NiP having a thickness between about 100 and 300 nm.

34. A microelectronic system suitable for reducing the formation of dendrites between current carrying leads comprising:
   a) a dielectric substrate having secured thereon;
   b) an adhesion promoting layer, to which is secured;
   c) a nickel-containing base layer, to which is secured;
   d) current carrying leads comprising a corrosible metal capable of providing a source of ions which, under electrolytic conditions form dendrites with adjacent leads;
   e) a nickel-containing coating which covers the sides and top of said metal current carrying leads,
   said nickel-containing coating on each said side intersecting and contacting said nickel-containing base layer to form a continuous non-corrosive coating that envelopes said current carrying leads.

35. The microelectronic system defined in claim 34 wherein a noble metal coating is deposited on the sides and top of said current-carrying leads intermediate said leads and said nickel-containing coating.

36. The microelectronic system defined in claim 34 wherein said adhesion promoting layer is a metal is selected from the group consisting of Cr, Nb, Ti or Ta.

37. The microelectronic system defined in claim 36 wherein the corrosible metal is selected from the group consisting of copper or copper alloys.

38. The microelectronic system defined in claim 37 wherein said nickel-containing coating is selected from the group consisting of Ni, NiP, NiB, NiCu or NiAu.

39. The microelectronic system defined in claim 38 wherein said nickel-containing coating is NiP having up to about 20% P.

40. The microelectronic system defined in claim 38 wherein said nickel-containing coating is NiB having up to about 20% B.

41. The microelectronic system defined in claim 38 wherein said nickel-containing coating is NiAu having between about 10 and 20 weight percent Ni.

42. The microelectronic system defined in claim 38 wherein said nickel-containing coating is NiCu having at least 10 weight percent Ni.

43. The microelectronic system defined in claim 39 wherein: said adhesion promoting metal layer has a thickness between about 20 nm and 40 nm;
   said current carrying leads have a thickness between about 3 μm and 1000 μm and width between about 3 μm and 1000 μm;
   said noble metal coating has a thickness between about 0.1 μm and 2.0 μm; and
   said nickel containing coating has a thickness between 0.03 and 2 μm.

44. The microelectronic system defined in claim 43 wherein the dielectric substrate is polyimide.

45. The microelectronic system defined in claim 44 wherein said adhesion promoting metal layer is Cr having a thickness of 30 nm.

46. The microelectronic system defined in claim 45 wherein said corrosible metal is copper having a height between about 20 and 40 μm and a width between about 25 and 100 μm.

47. The microelectronic system defined in claim 46 wherein said noble metal coating is gold having a thickness of about 0.6 μm.

48. The microelectronic system in claim 47 wherein said nickel-containing coating is NiP having a thickness between about 100 and 300 nm.

49. The microelectronic system defined in claim 1 wherein there is a voltage differential between at least two adjacent leads and substantially no dendrites are formed, said voltage being sufficient to form dendrites between adjacent leads formed from substantially pure copper under identical conditions.

* * * * *